United States Patent
Mizosaki et al.

[19]

[11] Patent Number: 5,998,766

[45] Date of Patent: Dec. 7, 1999

[54] APPARATUS AND METHOD FOR CLEANING SUBSTRATE SURFACE BY USE OF OZONE

[75] Inventors: Kengo Mizosaki, Kumamoto; Masaaki Yoshida, Kumamoto-ken, both of Japan

[73] Assignee: Tokyo Electron Limited, Tokyo, Japan

[21] Appl. No.: 08/791,617

[22] Filed: Jan. 31, 1997

[30] Foreign Application Priority Data

Feb. 8, 1996 [JP] Japan .................................. 8-045613

[51] Int. Cl.$^6$ .................................................. F27B 5/14
[52] U.S. Cl. ......................... 219/390; 219/393; 219/408
[58] Field of Search .................................. 392/416, 418; 219/405, 411, 390, 391, 392, 393, 400; 134/1.3, 1, 61, 105

[56] References Cited

U.S. PATENT DOCUMENTS

| | | | |
|---|---|---|---|
| 4,581,520 | 4/1986 | Vu | 219/349 |
| 4,654,509 | 3/1987 | Robinson | 219/405 |
| 5,127,365 | 7/1992 | Koyama | 219/390 |
| 5,314,574 | 5/1994 | Takahashi | 156/646 |
| 5,414,244 | 5/1995 | Imahashi | 219/497 |
| 5,433,791 | 7/1995 | Brewer | 118/724 |
| 5,480,492 | 1/1996 | Udagawa et al. | 134/2 |

FOREIGN PATENT DOCUMENTS 4-9373 2/1992 Japan .

OTHER PUBLICATIONS

Catalog by SEN Engineering Co., Ltd. on Ultraviolet Cleaning/Ultraviolet Surface Modification available in 1992.

*Primary Examiner*—Teresa Walberg
*Assistant Examiner*—Thor S. Campbell
*Attorney, Agent, or Firm*—Oblon, Spivak McClelland, Maier & Neustadt, P.C.

[57] ABSTRACT

This invention relates to a processing apparatus having an object holding means for holding an object to be processed, a processing chamber for housing the object to be processed and the object holding means, an ultraviolet irradiation means for irradiating ultraviolet rays on the object to be processed, an ultraviolet irradiation means chamber incorporating the ultraviolet irradiation means, an opening/closing means for opening/closing an opening for allowing the processing chamber to communicate with the ultraviolet irradiation means chamber, a first exhaust means for exhausting ozone which is produced upon irradiation of the ultraviolet ray by the ultraviolet irradiation means and present in the processing chamber, and a second exhaust means for exhausting ozone produced in the ultraviolet irradiation means chamber, and a processing method using the same.

31 Claims, 7 Drawing Sheets

FIG. 7

APPARATUS AND METHOD FOR CLEANING SUBSTRATE SURFACE BY USE OF OZONE

BACKGROUND OF THE INVENTION

The present invention relates to a processing apparatus and method for a pre-process of coating an object to be processed such as an LCD substrate.

Generally, the process of manufacturing a liquid crystal display apparatus employs photolithography used in a semiconductor manufacturing process in order to form, e.g., an ITO (Indium Tin Oxide) thin film or an electrode pattern on an LCD substrate (glass substrate). More specifically, the following series of processes (so-called resist process) are performed. A photoresist film is formed on an LCD substrate having a film to be processed, a circuit pattern or the like is transferred onto this photoresist film, and the photoresist film is partially removed by a developing process.

For example, after the LCD substrate is cleaned by a cleaning apparatus, it is hydrophobically treated by an adhesion apparatus and cooled by a cooling apparatus. Then, a photoresist film, e.g., a photo-sensitive film is applied and formed on the LCD substrate by a resist coating apparatus. After the LCD substrate having the photoresist film is heated and baked (pre-baked) by a heating apparatus, it is exposed by an exposure apparatus to have a predetermined pattern transferred on the photoresist film. After the exposed LCD substrate is developed by a developing apparatus, it is baked (post-baked) to polymerize the photoresist film and enhance adhesion between the LCD substrate and the resist pattern.

The LCD substrate which is subjected to the above processes undergoes various film formation processes before the resist coating process. For this reason, in temporarily storing or conveying the LCD substrate during the process, it is exposed to the outer atmosphere, and particles and organic contaminants may be attached thereto. To remove the particles and organic contaminants, the surface of the LCD substrate is cleaned using a brush and a cleaning solution in a pre-process of the resist process. To enhance adhesion of the resist film to the LCD substrate, an adhesion process is performed.

As a means of removing organic contaminants, there is known a technique of decomposing the organic contaminants by using ozone produced upon irradiation of ultraviolet rays on an object to be processed, e.g., a semiconductor wafer to which the organic contaminants are attached (Jpn. Pat. Appln. KOKOKU Publication No. 4-9373). According to this technique, when an ultraviolet lamp, e.g., a low-pressure mercury lamp is turned on, ultraviolet rays of a mercury resonance line having a wavelength of 254 nm are mainly externally radiated, ultraviolet rays of 185 nm are secondarily radiated, and ultraviolet rays of other wavelengths are slightly radiated. By using this production mechanism, organic contaminants are decomposed. That is, ozone is produced by the ultraviolet rays having a wavelength of 185 nm among these ultraviolet rays, and the ozone is decomposed by the ultraviolet rays having a wavelength of 254 nm to produce oxygen as a generated radical. The oxygen as the generated radical decomposes the organic contaminants and scatters them as a gas.

In the above cleaning process, however, the organic contaminants attached to the LCD substrate cannot be completely removed, and a uniform resist film cannot be formed in the next resist process, resulting in a decrease in yield.

Further, although the organic contaminants can be decomposed and removed in this technique, no implement is provided to effectively use ozone produced from an ultraviolet irradiation means, and the LCD substrate cannot be sufficiently cleaned. In addition, an apparatus, an equipment, and the like, except for the object to be processed, must be prevented from being adversely affected by ozone produced from the ultraviolet irradiation means, and leakage of the ozone outside the apparatus must be prevented.

BRIEF SUMMARY OF THE INVENTION

The present invention has been made in consideration of the above situation, and has as its object to provide a processing apparatus and method for removing organic contaminants attached to an object to be processed by effectively using ozone.

To achieve the above object, according to the present invention, a processing apparatus is characterized by comprising object holding means for holding an object to be processed, a processing chamber for housing the object to be processed and the object holding means, ultraviolet irradiation means for irradiating an ultraviolet ray on the object to be processed, an ultraviolet irradiation means chamber incorporating the ultraviolet irradiation means, opening/closing means for opening/closing an opening for allowing the processing chamber to communicate with the ultraviolet irradiation means chamber, first exhaust means for exhausting ozone which is produced upon irradiation of the ultraviolet ray by the ultraviolet irradiation means and present in the processing chamber, and second exhaust means for exhausting ozone produced in the ultraviolet irradiation means chamber.

In the processing apparatus of the present invention, the object holding means and the ultraviolet irradiation means are preferably set to be relatively movable parallel. The object holding means and the ultraviolet irradiation means are preferably set to be able to relatively come close to or be separated from each other. The object holding means and the ultraviolet irradiation means are preferably set to be relatively movable parallel and to be able to relatively come close to or be separated from each other. Note that, if the object holding means and the ultraviolet irradiation means are set at predetermined positions opposite to each other, both of them may be fixed.

In the processing apparatus of the present invention, the object holding means preferably has heating means and/or cooling means.

In the processing apparatus of the present invention, the first exhaust means preferably has an opening/closing mechanism for stopping/starting exhaust, and the second exhaust means preferably has an opening/closing mechanism for stopping/starting exhaust.

In the processing apparatus of the present invention, the second exhaust means preferably has heat dissipation means for externally dissipating heat from the ultraviolet irradiation means chamber to an outer atmosphere.

According to the present invention, a processing method is characterized by comprising the steps of placing an object to be processed on object holding means in a processing chamber, moving at least one of the object holding means and the ultraviolet irradiation means to an ultraviolet irradiation position, irradiating an ultraviolet ray on the object to be processed, moving at least one of the object holding means and the ultraviolet irradiation means to a position shifted from the ultraviolet irradiation position, causing first exhaust means to exhaust ozone which is produced upon irradiation of the ultraviolet ray by the ultraviolet irradiation means and present in the processing chamber, and causing second exhaust means to exhaust ozone produced in an ultraviolet irradiation means chamber incorporating the ultraviolet irradiation means.

In the processing method of the present invention, the step of irradiating an ultraviolet ray on the object to be processed is preferably performed when an opening for allowing the processing chamber to communicate with the ultraviolet irradiation means chamber is closed by opening/closing means, and in this state the ultraviolet irradiation means is operated to open the opening by the opening/closing means.

The processing method of the present invention preferably comprises the step of causing heat dissipation means to dissipate heat from the ultraviolet processing means chamber, and the step of causing heat dissipation means to dissipate heat preferably comprises causing the heat dissipation means to always dissipate heat during a process.

According to the processing method of the present invention, the step of irradiating an ultraviolet ray on the object to be processed preferably comprises moving the ultraviolet irradiation means parallel to a surface of the object to be processed, and changing a distance between the object holding means and the ultraviolet irradiation means.

According to the processing method of the present invention, the step of irradiating an ultraviolet ray on the object to be processed preferably comprises stopping exhaust of ozone which is produced upon irradiation of the ultraviolet ray by the ultraviolet irradiation means and present in the processing chamber.

The processing method of the present invention preferably comprises exhausting the ozone present in the ultraviolet irradiation means chamber while an opening is closed by opening/closing means.

According to the present invention, after the object to be processed to which organic contaminants are attached is placed on the object holding means in the processing chamber, the interior of the processing chamber is sealed from the outer atmosphere. The object holding means is operated to move the object to the ultraviolet irradiation position. Ultraviolet rays are irradiated on the object for a predetermined period of time. With this operation, the organic contaminants attached to the object can be decomposed and removed effectively using ozone produced from the ultraviolet irradiation means. In addition, by removing the organic contaminants, the surface energy of the object can be decreased to decrease the contact angle and improve so-called "wettability". Therefore, the next process, e.g., a cleaning or coating process can be improved.

Further, by externally exhausting ozone supplied for a process in the processing chamber and another ozone produced from the ultraviolet irradiation means, leakage of the ozone to the outside can be prevented, and an apparatus, an equipment, and the like can be prevented from being adversely affected by the ozone.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described in detail below with reference to the accompanying drawings. The embodiments will exemplify a case wherein a processing apparatus according to the present invention is applied to a coating system for an LCD substrate.

Figure 1:
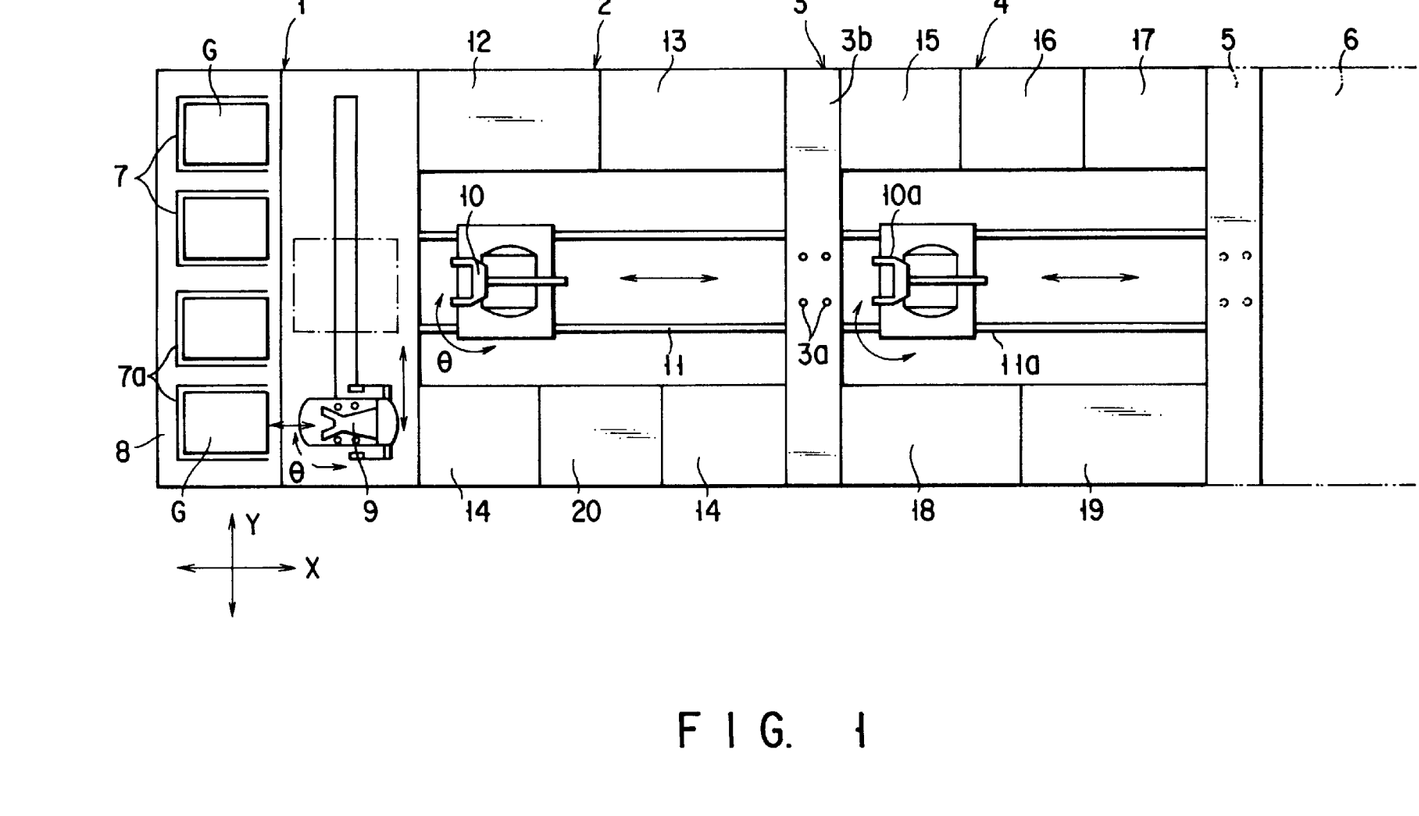
FIG. 1 is a schematic plan view showing a coating system for an LCD substrate to which a processing apparatus of the present invention is applied.

As shown in FIG. 1, the above coating system is mainly constituted by a loader section 1 for loading/unloading an LCD substrate G (to be referred to as a substrate hereinafter; in this specification, the substrate means an LCD substrate itself or an LCD substrate having various films formed thereon) as an object to be processed, a pre-processing section 2 for the substrate G, and a coating section 4 continuously arranged to the pre-processing section 2 via a relay section 3. A developing section 6 is continuously arranged to the coating section 4 via a relay section 5, and an exposure apparatus (not shown) for exposing a predetermined micropattern onto a resist film is continuously arranged to the developing section 6 via a transfer section.

The loader section 1 is constituted by a cassette table 8 on which cassettes 7 for storing unprocessed substrates G and cassettes 7a for storing processed substrates G are mounted, and substrate load/unload tweezers 9 which are movable in the horizontal (X, Y) and vertical (Z) directions and rotatable (θ) so as to load/unload the substrate G between the cassettes 7 and 7a on the cassette table 8.

In the pre-processing section 2, a brush cleaning apparatus 12 for cleaning the substrate G with a brush, and a jet-water cleaning apparatus 13 for cleaning the substrate G with high-pressure jet water are arranged on one side of a convey path 11 of a main arm 10 movable in the X, Y, and Z directions and rotatable (θ). Heating apparatuses 14 for the substrate G and a processing apparatus 20 having an ozone irradiation means according to the present invention are arranged on the other side of the convey path 11.

The coating section 4 has a main arm 10a movable in the X, Y, and Z directions and rotatable (θ), similar to the pre-processing section 2. An adhesion apparatus 15 for hydrophobically treating the surface of the substrate G, a cooling apparatus 16 for cooling the substrate G to a predetermined temperature, and a heating apparatus 17 for heating the substrate G to a predetermined temperature are arranged on one side of a convey path 11a of the main arm 10a. A resist coating apparatus 18 and a coating film removing apparatus 19 are arranged on the other side of the convey path 11a.

The relay section 3 has a structure in which casters (not shown) are attached to the bottom surface of a box 3c having a transfer table 3b on which support pins 3a for supporting the substrate G extend upright. If necessary, the relay section 3 is separated from the pre-processing section 2 and the coating section 4 to ensure a space for allowing the operator to enter the pre-processing section 2 or the coating section 4 and easily repair and examine it.

Although not shown, the developing section 6 also has a convey mechanism having a convey path and a main arm, similar to the pre-processing section 2 and the coating section 4. A heating apparatus for performing pre-bake/post-bake before/after a developing process and a developing apparatus (neither are shown) are arranged to interpose the convey path of the convey mechanism.

In the coating system having the above arrangement, an unprocessed substrate G stored in the cassette 7 is picked up by the substrate load/unload tweezers 9 of the loader section 1, transferred to the main arm 10 of the pre-processing section 2, and conveyed to the processing apparatus 20. In the processing apparatus 20, after organic contaminants attached to the substrate G are removed by ozone produced upon irradiation of ultraviolet rays on the substrate G by an ultraviolet irradiation means, the substrate G is conveyed in the brush cleaning apparatus 12. The substrate G cleaned with the brush in the brush cleaning apparatus 12 is cleaned with high-pressure jet water in the jet-water cleaning apparatus 13, as needed. Thereafter, the substrate G is hydrophobically treated by the adhesion apparatus 15, cooled by the cooling apparatus 16, and coated with a photoresist film, i.e., a photosensitive film by the resist coating apparatus 18. Subsequently, an unnecessary resist film at the peripheral portion of the substrate G is removed by the coating film removing apparatus 19. After the resultant photoresist film is heated and baked by the heating apparatus 17, the substrate G is exposed with a predetermined pattern by the exposure apparatus. The exposed substrate G is conveyed in the developing apparatus of the developing section 6 and developed with a developing solution. Then, the developing solution is washed off with a rinse solution, completing the developing process.

The processing apparatus of the present invention will be described below.

(First Embodiment)

Figure 2:
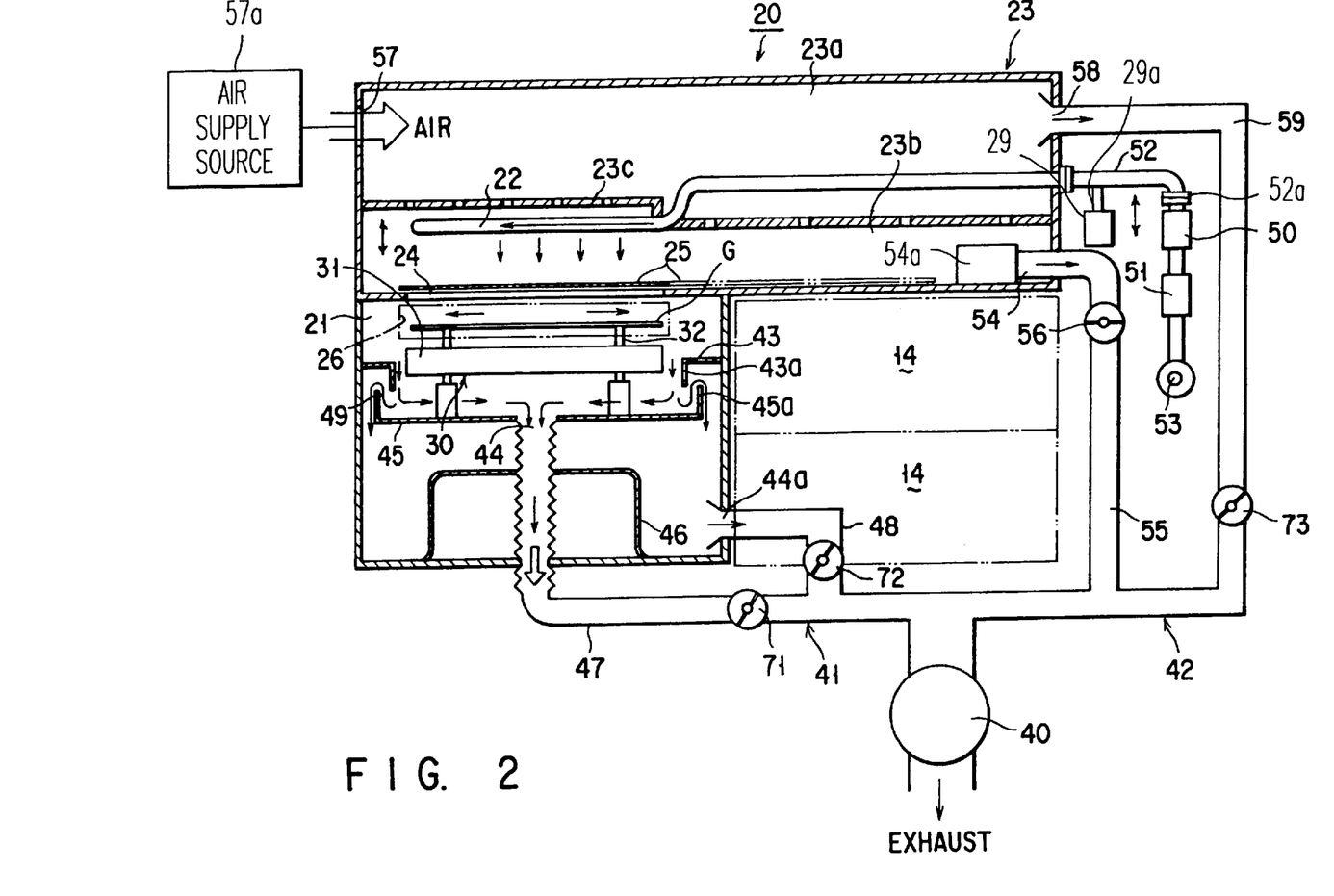
FIG. 2 is a schematic sectional view showing a processing apparatus according to the first embodiment of the present invention.

FIG. 2 is a schematic sectional view showing a processing apparatus of the present invention.

The processing apparatus 20 comprises a processing chamber 21 for processing the substrate G, a lamp chamber (ultraviolet irradiation means chamber) 23 arranged above the processing chamber 21 and housing an ultraviolet irradiation means, e.g., ultraviolet lamps 22, a lamp shutter (opening/closing means) 25 for opening/closing an opening 24 formed between the processing chamber 21 and the lamp chamber 23, a first exhaust means 41 connected to the processing chamber 21, and a second exhaust means 42 connected to the lamp chamber 23.

A load/unload port 26 for the substrate G is formed in the side surface of the processing chamber 21, and can be opened/closed by a unit shutter 28 which is vertically operated by a cylinder 27. A holding means (object holding means) 30 for holding the substrate G loaded in the processing chamber 21 via the load/unload port 26 by the main arm 10 is arranged in the processing chamber 21.

Figure 3:
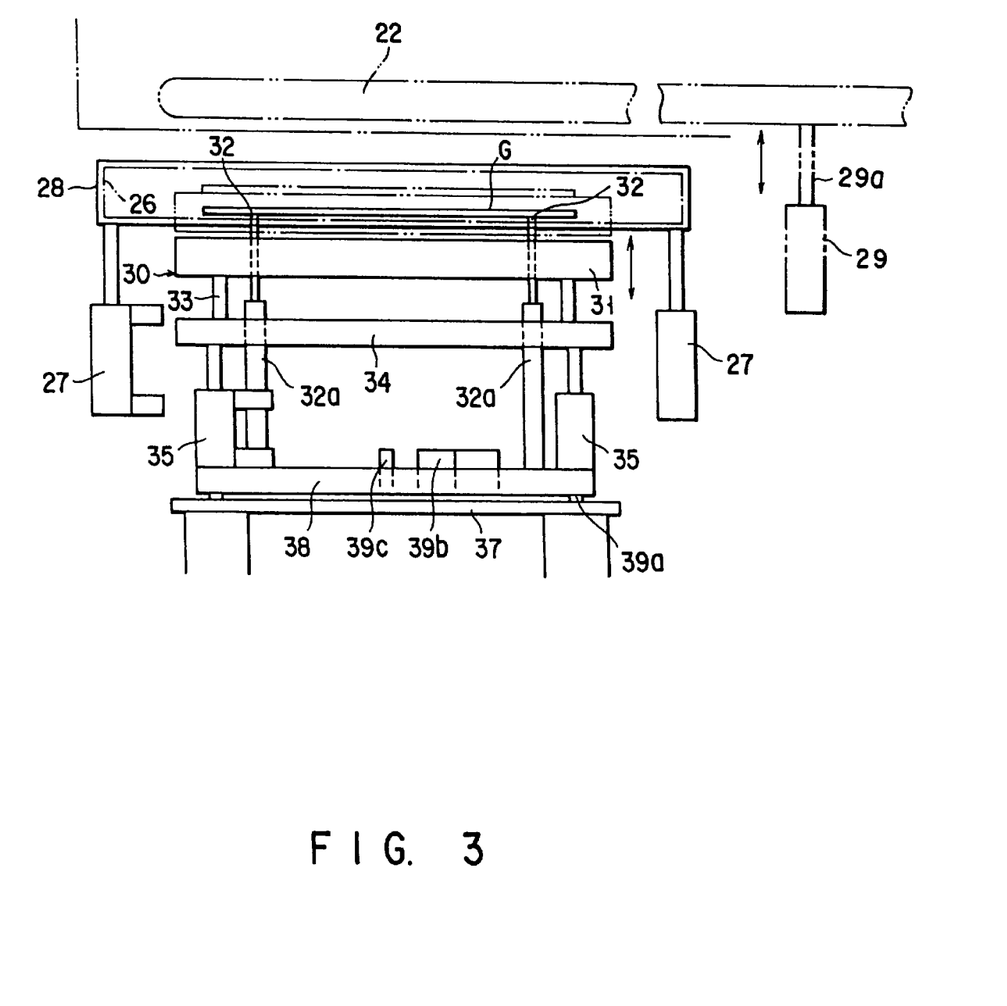
FIG. 3 is a schematic side view showing a holding means in the present invention.
Figure 4A:
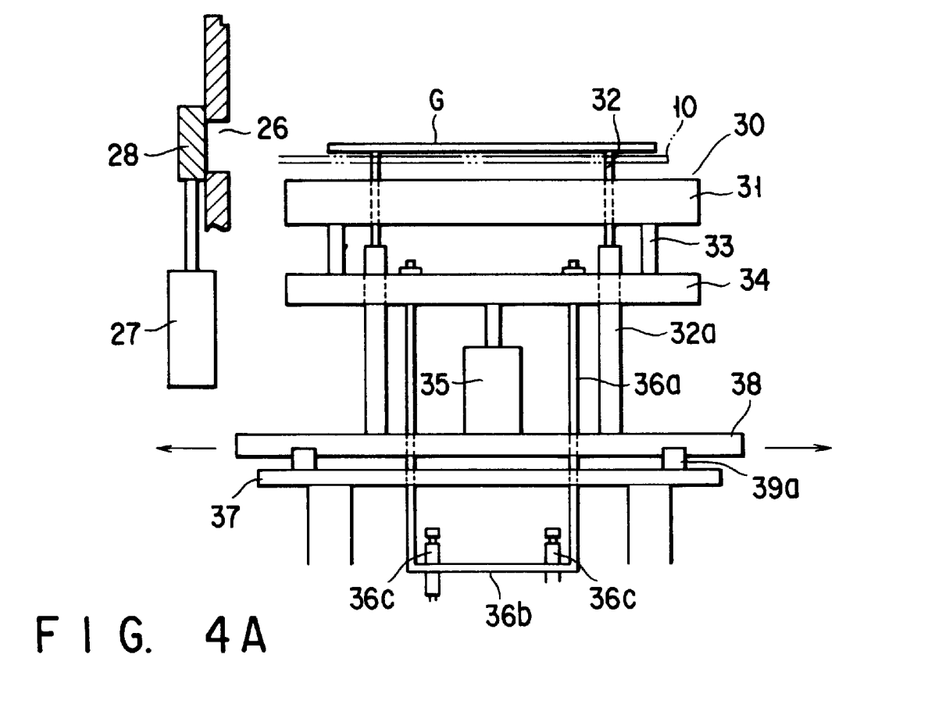
FIG. 4A is a schematic side view showing the state of an object to be processed before holding.
Figure 4B:
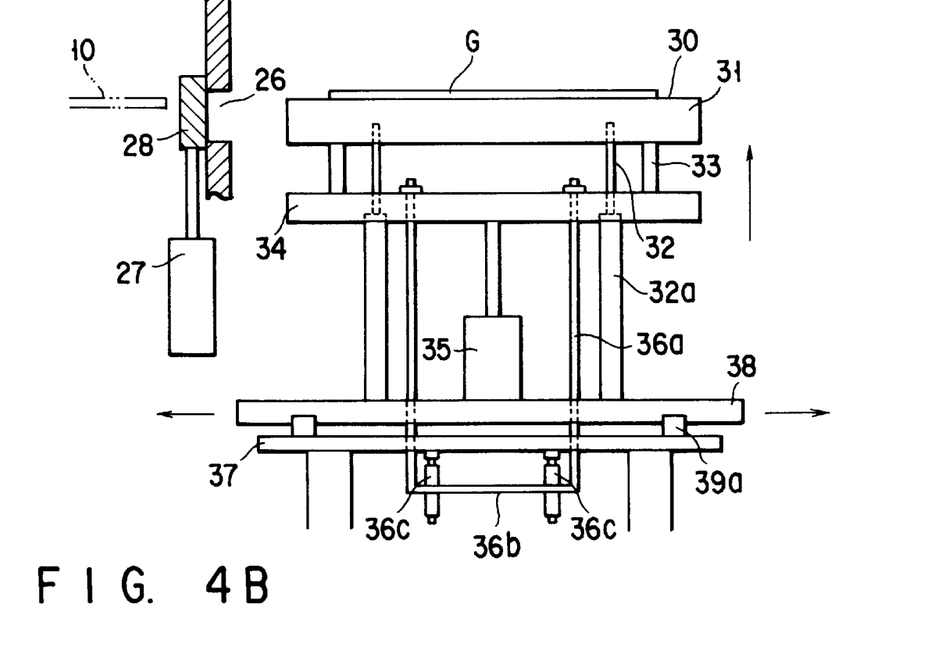
FIG. 4B is a schematic side view showing the state of the object to be processed during holding.

As shown in FIGS. 3 and 4, the holding means 30 has an aluminum-alloy table 31 which undergoes, e.g., a frame process and places the substrate G thereon, support pins 32 freely fitted in a plurality of, e.g., four through holes (not shown) formed in the table 31, and a table moving cylinder 35 coupled to a support plate 34 supporting the table 31 via support bars 33 so as to vertically move the table 31. In this case, the support plate 34 is slidably fitted on columns 32a supporting the lower portions of the support pins 32. With this arrangement, by driving the table moving cylinder 35, the table 31 can move downward to make the support pins 32 project from the table 31 and receive the substrate G from the support pins 32, and move upward to a portion above the support pins 32 to place the substrate G thereon. At the same time, the table 31 can move the substrate G to an optimal position for irradiation of ozone produced from the ultraviolet lamps 22.

In this case, two vertical bars 36a are hung from the lower surface of the support plate 34, and a positioning member 36c is attached to a plate member 36b arranged between the lower end portions of the vertical bars 36a. The positioning member 36c is moved together with the table 31. The positioning member 36c comes in contact with the lower surface of a stationary plate 37 arranged below the table 31 to stop the upward movement of the table 31, i.e., to stop the substrate G at a position closest to the ultraviolet lamps 22 where ozone is optimally irradiated. The shortest distance between the ultraviolet lamps 22 and the substrate G is about 10 mm. Note that the positioning member 36c comprises, e.g., a screw so as to be finely adjustable.

In the above description, the table 31 is vertically moved with respect to the support pins 32. However, it is also possible to fix the table 31 and vertically move the support pins 32.

The columns 32a supporting the support pins 32 and the table moving cylinder 35 are set on a holding plate 38, which is attached to the upper surface of the stationary plate 37 via a linear guide 39a to be horizontally movable. The holding plate 38 is coupled to a pulley 39c rotated by a stepping motor 39b which is rotatable in the forward and backward directions via an endless belt (not shown). The holding plate 38 is horizontally moved by driving the stepping motor 39b. By horizontally moving the holding plate 38, the support pins 32, the table moving cylinder 35, and the table 31 can horizontally move, and at the same time the substrate G held on the table 31 can move (swing) in parallel to the ultraviolet lamps 22. Since the substrate G swings, ozone produced from the ultraviolet lamps 22 can be uniformly irradiated on the surface of the substrate G. Note that the swinging speed of the substrate G is preferably a self-motive speed of motor in consideration of motor acceleration, and the swinging movement distance of the substrate G is preferably half of lamp pitch interval in consideration of illuminance distribution.

A side cover 43 which has a section of a substantially lateral L shape and extends toward the outer peripheral portion of the table 31 is attached to the inner peripheral surface of the processing chamber 21. A cup 45 having an exhaust port 44 at its center and an upright piece 45a arranged at its peripheral edge so as to overlap a hanging piece 43a of the side cover 43 is attached to a position below the table 31. A driving control section for the table moving cylinder 35, the stepping motor 39b, and the like is arranged at the lower portion of the processing chamber 21 and partitioned from the processing chamber 21 by a lower cover 46. A first exhaust pipe 47 is connected to the exhaust port 44, and a second exhaust pipe 48 is connected to a side exhaust port 44a formed in the lower side surface of the processing chamber 21. The first and second exhaust pipes 47 and 48 and an exhaust fan 40 interposed between the first and second exhaust pipes 47 and 48 constitute the first exhaust means 41. Note that, if leakage of ozone can be prevented by airtightly continuously arranging the side cover 43 and the cup 45, the first exhaust means 41 may be constituted by the first exhaust pipe 47 and the exhaust fan 40.

With this arrangement, when the exhaust fan is driven, ozone irradiated on the upper surface of the substrate G on the table 31 flows down from the surface of the substrate G to its periphery, and then flows through the first exhaust pipe 47 via the central exhaust port 44. On the other hand, ozone which leaks from a gap 49 between the hanging piece 43a of the side cover 43 and the upright piece 45a of the cup 45 flows through the second exhaust pipe 48 via the exhaust port 44a and is exhausted.

A plurality of, e.g., seven ultraviolet lamps 22 (e.g., low-pressure mercury lamps) are horizontally aligned parallel to each other in the lamp chamber 23. The ultraviolet lamps 22 are connected to an air supply source 53 via a pipe path 52 having a flow rate regulator 50 and a filter 51 interposed therein. Clean air supplied from the air supply source 53 can be supplied to the surface of the substrate G via the opening 24, and the produced ozone can be efficiently used. To minimize turbulence of the atmosphere, no air purge line is preferably provided.

Each ultraviolet lamp 20 has a rod 29a and a cylinder 29. When the rod 29a is retreated into the cylinder 29, the ultraviolet lamp 22 moves down and comes closer to the substrate G. When the rod 29a is advanced from the cylinder 29, the lamp 22 moves up and away from the substrate G. The pipe path 52 has a flexible portion 52a, so that the pipe path 52 can be moved in accordance with the vertical movement of the lamp 22.

The lamp chamber 23 is partitioned into upper and lower chambers 23a and 23b by a partitioning plate 23c having a large number of small holes and having a shape so as to not cause interference between the ultraviolet lamp 22 and the pipe path 52. The lower chamber 23b has a lower exhaust port 44a in its side surface. A third exhaust pipe 55 is connected to the lower exhaust port 44a via a catalyst 54. The third exhaust pipe 55 merges with the first and second exhaust pipes 47 and 48, and has the exhaust fan 40 interposed therein to externally exhaust ozone produced in the lamp chamber 23. Opening/closing dampers 71 and 72 (exhaust opening/closing mechanisms) for exhausting ozone are interposed between the first and second exhaust pipes 47 and 48, respectively. By opening/ closing the dampers 71 and 72, ozone in the processing chamber 21 can be selectively exhausted. That is, when the lamp shutter 25 for opening/closing the opening 24 formed between the processing chamber 21 and the lamp chamber 23 is opened by a cylinder (not shown; during irradiation of ultraviolet rays), ozone produced from the ultraviolet lamps 22 is externally exhausted by opening the dampers 71 and 72. When the lamp shutter 25 is closed, the dampers 71 and 72 are closed.

An opening/closing damper 56 (exhaust opening/closing mechanism) for exhausting ozone is interposed in the third exhaust pipe 55. By opening/closing the damper 56, ozone in the lamp chamber 23 can be selectively exhausted. That is, when the lamp shutter 25 for opening/closing the opening 24 formed between the processing chamber 21 and the lamp chamber 23 is opened by a cylinder (not shown), ozone produced from the ultraviolet lamps 22 is efficiently supplied to the substrate G side by closing the damper 56. When the lamp shutter 25 is closed, ozone present in the lamp chamber 23 is externally exhausted by opening the damper 56.

An air supply port 57 is formed in one of opposite side surfaces of the upper chamber 23a, and an upper exhaust port 58 is formed on the other side. The port 57 communicates to an air supply source 57a. In this case, an air filter may be attached to the air supply port 57. A fourth exhaust pipe 59 is connected to the upper exhaust port 58. An opening/closing damper 73 (exhaust opening/closing mechanism) for dissipating heat is interposed in the fourth exhaust pipe 59. By opening/closing the damper 73, heat in the lamp chamber 23 can be dissipated. The fourth exhaust pipe 59 merges with the first and second exhaust pipes 47 and 48, and has the exhaust fan interposed therein to always externally exhaust heated air generated in the lamp chamber 23 and cool the interior of the lamp chamber 23.

The third exhaust pipe 55 and the fourth exhaust pipe 59 constitute the second exhaust means 42. By the second exhaust means 42, ozone produced in the lamp chamber 23 can be externally exhausted to protect electronic devices and the like from ozone, and the lamp chamber 23 can always be cooled to prevent thermal damage.

As the dampers 56 and 71 to 73, dampers of a seal type, hand-operated type, and the like can be properly used.

Next, a procedure of removing organic contaminants attached to the surface of the substrate G by using the processing apparatus with the above arrangement will be explained.

First, as shown in FIGS. 3 and 4A, when the unit shutter 28 is moved down to open the load/unload port 26, the substrate G conveyed by the main arm 10 of the preprocessing section 2 is transferred to the support pins 32 projecting from the table 31. As shown in FIG. 4B, after the main arm 10 which has transferred the substrate G to the support pins 32 is retracted outside the processing chamber 21, the unit shutter 28 moves up to close the load/unload port 26. At the same time, the table 31 moved up by driving the table moving cylinder 35 holds the substrate G and moves it to an ultraviolet irradiation position.

When the substrate G is moved to the ultraviolet irradiation position, and the lamp shutter 25 is opened by driving a cylinder (not shown), ozone produced from the ultraviolet lamps 22 is irradiated on the surface of the substrate G via the opening 24 to decompose and remove organic contaminants attached to the surface of the substrate G. The ozone which decomposes and removes the organic contaminants flows down from the peripheral edge of the substrate G by the first exhaust means 41 and is externally exhausted via the exhaust port 44 and the side exhaust port 44a. Note that since the damper 56 of the second exhaust means 42 is closed while the lamp shutter 25 is open, the ozone produced from the ultraviolet lamps 22 can be efficiently supplied to the substrate G side. In addition, the table 31 and the substrate G are horizontally moved (swung) by driving the stepping motor 39b during irradiation of ozone on the substrate G, thereby uniformly irradiating ozone on the entire surface of the substrate G and efficiently removing the organic contaminants. Note that the substrate G may be moved to be close to or separated from the ultraviolet lamps 22 during irradiation of ozone, as needed.

After the lamp shutter 25 is kept open for a predetermined time, and ozone is irradiated on the substrate G, the unit shutter 28 is moved down to open the load/unload port 26, and the table 31 is moved down. Then, the lamp shutter 25 is closed, and the substrate G is supported by the support pins 32. The main arm 10 of the pre-processing section 2 enters the processing chamber 21 to receive the substrate G and unload it outside the processing chamber 21, completing the process. Note that since ozone remaining in the pre-processing section 2 is externally exhausted by the first exhaust means 41 even if the unit shutter 28 is open, the ozone does not leak to the pre-processing section 2. In addition, since the damper 56 of the second exhaust means 42 is open while the lamp shutter 25 is closed, ozone produced in the lamp chamber 23 is externally exhausted from the third exhaust pipe 55.

With the processing apparatus having the above arrangement, since organic contaminants attached to the substrate G can be removed by irradiating ozone on the substrate G to be cleaned by the cleaning apparatuses 12 and 13 or to be hydrophobically treated by the adhesion apparatus 15, the contact angle of the substrate G can be decreased, i.e., the "wettability" of the substrate G can be improved. Therefore, the cleaning effect by the cleaning apparatuses 12 and 13 can be increased. In the resist coating process after the adhesion process, a resist solution can be prevented from running away to make the resist film uniform, resulting in an increase in yield.

(Second Embodiment)

Figure 5:
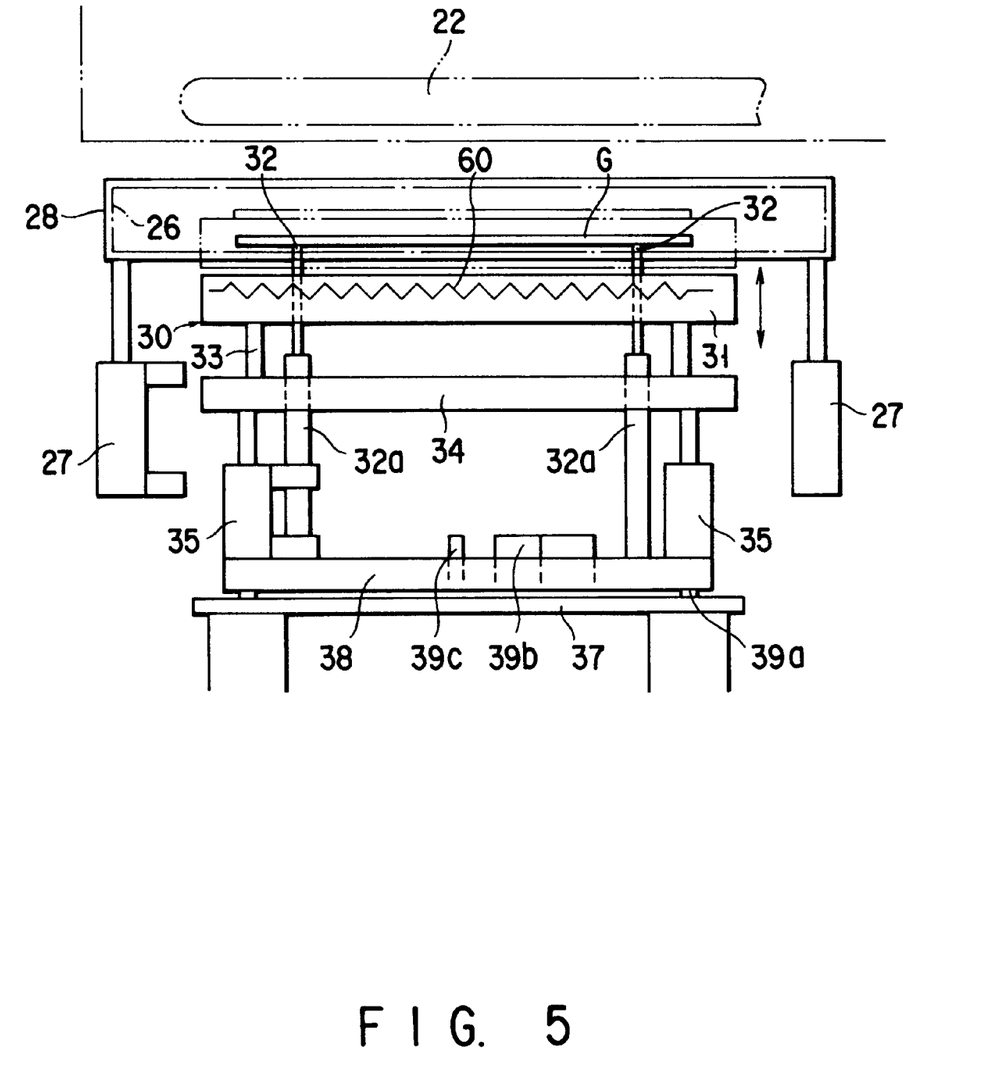
FIG. 5 is a schematic sectional view showing the main part of a processing apparatus according to the second embodiment of the present invention.

FIG. 5 is a schematic sectional view showing a processing apparatus according to the second embodiment of the present invention. The second embodiment exemplifies a case wherein ozone produced from ultraviolet lamps 22 is further activated to more efficiently remove organic contaminants attached to a substrate G. More specifically, a heating means, e.g., a heater 60 is incorporated in the above table 31. While ozone is irradiated from the ultraviolet lamps 22 on the substrate G held by the table 31, the heater 60 is operated to heat the substrate G, thereby further activating oxygen produced upon decomposition of the ozone, and more efficiently decomposing and removing the organic contaminants. The heating means need not always be the heater 60. For example, in addition to the heater 60, a heating medium may flow through a circulating passage formed in the table 31.

Since the remaining parts in the second embodiment are the same as those in the first embodiment, the same reference numerals denote the same parts, and a description thereof will be omitted.

(Third Embodiment)

Figure 6:
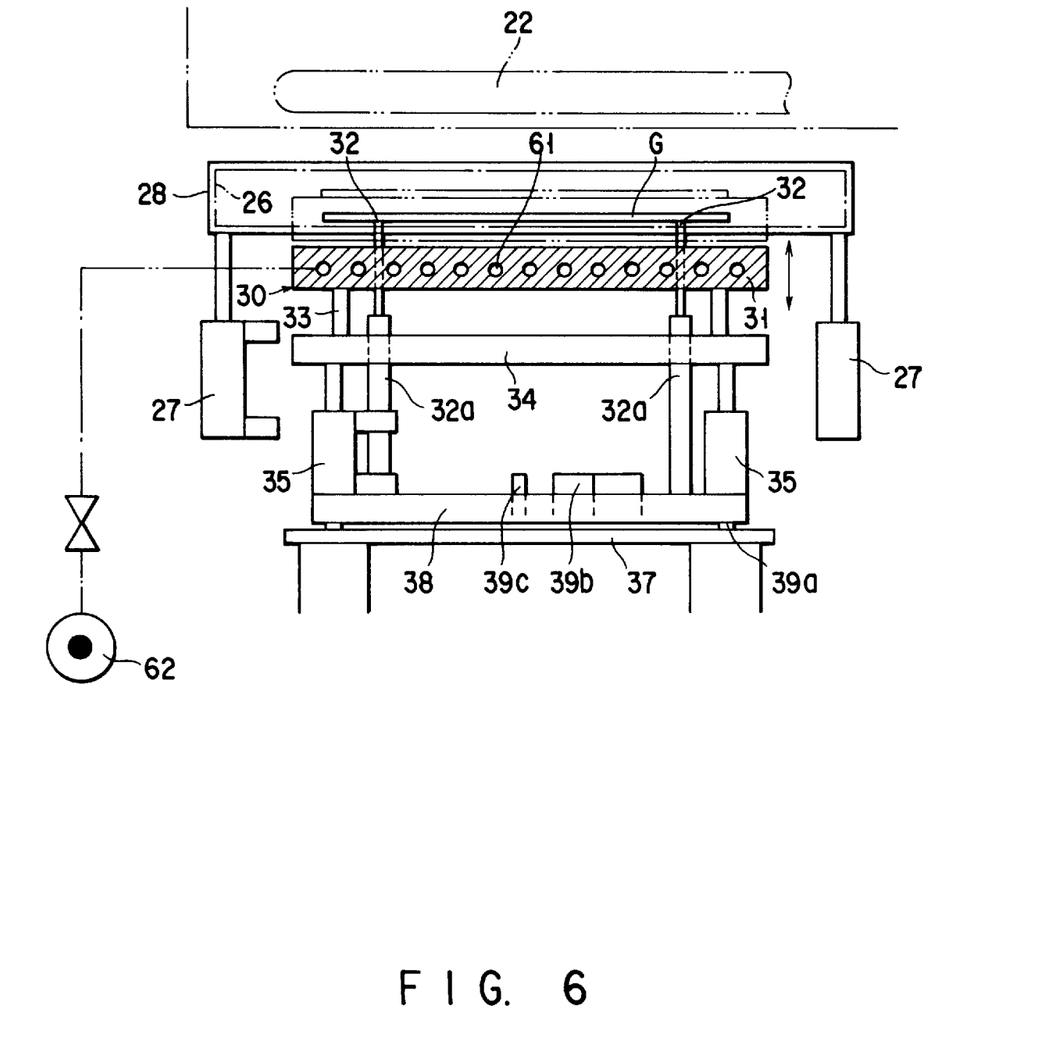
FIG. 6 is a schematic sectional view showing the main part of a processing apparatus according to the third embodiment of the present invention.

FIG. 6 is a schematic sectional view showing a processing apparatus according to the third embodiment of the present invention. The third embodiment exemplifies a case wherein a substrate G is prevented from being adversely affected by heat generated from ultraviolet lamps 22. More specifically, a circulating passage 61 is formed inside the above table 31, and a coolant supply source 62 is connected to the circulating passage 61. A coolant solution having a predetermined temperature is flown through the circulating passage 61 to keep the substrate G on the table 31 at a constant temperature. By cooling the substrate G on the table 31, the temperature of the substrate G exposed to a high temperature due to the heat of the ultraviolet lamps 22 can be kept constant, ozone can be stably irradiated on the substrate G.

Since the remaining parts in the third embodiment are the same as those in the first embodiment, the same reference numerals denote the same parts, and a description thereof will be omitted.

(Fourth Embodiment)

Figure 7:
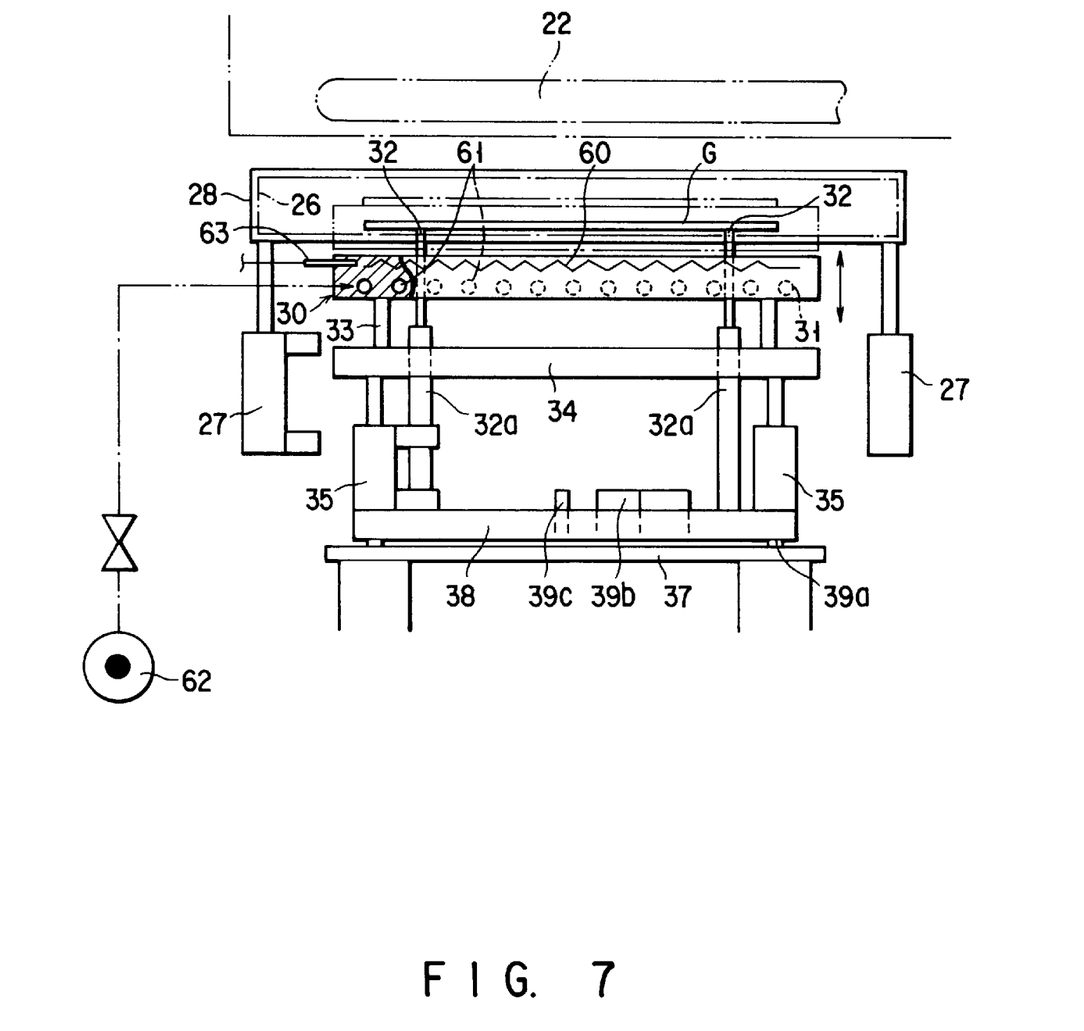
FIG. 7 is a schematic sectional view showing the main part of a processing apparatus according to the fourth embodiment of the present invention.

FIG. 7 is a schematic sectional view showing a processing apparatus according to the fourth embodiment of the present invention. The fourth embodiment exemplifies a case wherein ozone produced from ultraviolet lamps 22 is further activated to more efficiently remove organic contaminants attached to a substrate G, and the temperature of the substrate G is kept constant to stabilize the process. More specifically, a heating means, e.g., a heater 60 is incorporated in the above table 31. In addition, a circulating passage 61 for a coolant solution is formed inside the table 31, and a coolant supply source 62 is connected to the circulating passage 61. A detection signal from a temperature detection means, e.g., a thermocouple 63 for detecting the temperature of the table 31 is controlled and processed by a control means (not shown), e.g., a CPU, and transferred to the heater 60 or the coolant supply source 62 to selectively perform heating of the heater 60 or coolant supply from the coolant supply source 62.

With this arrangement, for example, the substrate G can be heated by operating the heater 60, thereby further activating oxygen produced upon decomposition of ozone and more efficiently decomposing and removing organic contaminants. In addition, the substrate G on the table 31 can be kept at a constant temperature by flowing a coolant solution having a predetermined temperature through the circulating passage 61, thereby stably irradiating ozone on the substrate G.

Since the remaining parts in the fourth embodiment are the same as those in the first embodiment, the same reference numerals denote the same parts, and a description thereof will be omitted.

(Another Embodiment)

In the above embodiments, the table 31 is moved to be close to or separated from the ultraviolet lamps 22. However, the table 31 need not always be moved. The ultraviolet lamps 22 may be moved to be close to or separated from the table 31, i.e., the substrate G side, or both of them may be movable to be closer to or separated from each other.

In the above embodiments, the table 31 is formed to be horizontally movable with respect to the ultraviolet lamps 22, and the substrate G is swung. However, the table 31 need not always be horizontally moved. The ultraviolet lamps 22 may be horizontally movable with respect to the table 31, i.e., the substrate G, or both of them may be relatively horizontally movable.

In the present invention, a control apparatus (not shown) may be electrically connected to control the open/closed states of the dampers 56 and 71 to 73 on the basis of the opening/closing operation of an opening/closing means. In addition, a movement means for moving the table to be close to the lamps or separate from the lamps and/or a horizontal movement means may be electrically connected to the control apparatus to feedback-control the movement means for moving the table to be close to the lamps or separate from the lamps and/or the horizontal movement means in accordance with the condition and state of the ultraviolet irradiation process.

In the above embodiments, the object to be processed is an LCD substrate. The processing apparatus of the present invention can similarly process a semiconductor wafer, a glass substrate, a CD, and the like, other than the LCD substrate.

As has been described above, according to the present invention, by moving an object to be processed to which organic contaminants are attached to the ultraviolet irradiation position, and irradiating ultraviolet rays on the object for a predetermined period of time, the organic contaminants attached to the object can be decomposed and removed effectively using ozone produced from the ultraviolet irradiation means. At the same time, the contact angle of the object can be decreased, and so-called "wettability" can be improved. Therefore, the next process, e.g., a cleaning or coating process can be improved.

In addition, by externally exhausting ozone supplied for a process in the processing chamber and another ozone produced from the ultraviolet irradiation means, leakage of the ozone to the outside can be prevented, and an apparatus, an equipment, and the like can be prevented from being adversely affected by the ozone. Therefore, the service life of the apparatus can be prolonged.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

We claim:

1. A method for cleaning a surface of an object to be processed, comprising the steps of:
   placing the object on a support member in a first chamber;
   moving at least one of said support member and an ultraviolet lamp to an ultraviolet irradiation position so that the ultraviolet lamp and the object move closer to each other;
   irradiating an ultraviolet ray onto said object, from the ultraviolet lamp;
   moving at least one of said support member and said ultraviolet lamp to a position shifted from the ultraviolet irradiation position so that the ultraviolet lamp and the object move away from each other;
   causing first exhaust means to exhaust ozone which is produced upon irradiation of the ultraviolet ray by said ultraviolet lamp and present in said first chamber; and
   causing second exhaust means to exhaust ozone produced in a second chamber incorporating said ultraviolet lamp.

2. A method according to claim 1, wherein the step of irradiating an ultraviolet ray on said object is performed when an opening for allowing said first chamber to communicate with said second chamber is closed by a shutter, and in this state said ultraviolet lamp is operated to open the opening by said shutter.

3. A method according to claim 1, further comprising the step of causing heat dissipation means to dissipate heat from said second chamber.

4. A method according to claim 3, wherein the step of causing heat dissipation means to dissipate heat comprises causing said heat dissipation means to always dissipate heat during processing of the object.

5. A method according to claim 1, wherein the step of irradiating an ultraviolet ray on said object comprises moving said ultraviolet lamp parallel to a surface of said object.

6. A method according to claim 1, wherein the step of irradiating an ultraviolet ray on said object comprises changing a distance between said object and said ultraviolet lamp.

7. A method according to claim 1, wherein the step of irradiating an ultraviolet ray on said object comprises stopping exhaust of ozone which is produced upon irradiation of the ultraviolet ray by said ultraviolet lamp and exists in said first chamber.

8. A method according to claim 1, comprising exhausting the ozone present in said second chamber while an opening, through which the first chamber communicates with the second chamber, is closed by a shutter.

9. A method according to claim 1, wherein said first chamber is located lower than said second chamber, and said ozone produced in said second chamber flows down from said second chamber to said first chamber.

10. An apparatus for cleaning a surface of a substrate, comprising:
    substrate holding means for holding a substrate to be processed;
    a processing chamber in which said substrate held by said substrate holding means is arranged;
    a lamp chamber in which an ultraviolet lamp for radiating ultraviolet rays is arranged;
    gas supply sources for introducing a gas, which is an ozone source, at least into said lamp chamber;
    an opening through which said lamp chamber and said processing chamber communicate with each other;
    a lamp shutter for closing or opening said opening so as to allow or prevent supply of produced ozone from said lamp chamber into said processing chamber through said opening;
    a first exhausting circuit for exhausting said processing chamber; and
    a second exhausting circuit for exhausting said lamp chamber,
    wherein
    when processing is performed, said lamp shutter is driven to open said opening and said second exhausting circuit is closed, so that said produced ozone is introduced from said lamp chamber into said processing chamber and decomposes organic matter attaching on the surface of said substrate, and subsequently said first exhausting circuit is opened to exhaust said processing chamber of a substance generated by decomposition,
    when no processing is performed, said lamp shutter is closed and said second exhausting circuit is opened, so that said produced ozone is discharged to a region outside of said lamp chamber.

11. An apparatus according to claim 10, wherein said substrate holding means and said ultraviolet lamp are movable in parallel relative to each other.

12. An apparatus according to claim 10, wherein said substrate holding means and said ultraviolet lamp are movable closer to or away from each other.

13. An apparatus according to claim 10, wherein said substrate holding means and said ultraviolet lamp are movable in parallel relative to each other, and are also movable closer to or away from each other.

14. An apparatus according to claim 10, wherein said substrate holding means includes a heater for heating said substrate.

15. An apparatus according to claim 10, wherein said substrate holding means includes cooling means for cooling said substrate.

16. An apparatus according to claim 10, wherein said first exhausting circuit includes two opening/closing mechanisms for starting or stopping gas exhaustion.

17. An apparatus according to claim 10, wherein said second exhausting circuit includes an opening/closing mechanism for starting or stopping gas exhaustion.

18. An apparatus according to claim 10, wherein said first exhausting circuit and said second exhausting circuit communicate with a single exhaust fan.

19. An apparatus according to claim 10, wherein said gas supply source supplies air into said lamp chamber as an ozone-producing gas.

20. An apparatus according to claim 10, wherein said substrate is a rectangular glass plate designed for use as an LCD, and a plurality of ultraviolet lamps are arranged along the surface of said substrate.

21. An apparatus according to claim 10, further comprising:
an upper chamber arranged above said lamp chamber;
a gas supply source for introducing a gas into said upper chamber; and
a heat exhausting circuit for exhausting said upper chamber of said introduced gas and heat,
said heat exhausting circuit communicating with said second exhausting circuit.

22. An apparatus according to claim 21, further comprising:
a partitioning plate, having holes, for providing a partition between said upper chamber and said lamp chamber; and
a heat exhausting circuit, communicating with said second exhaust circuit, for exhausting said upper chamber,
heat generated in said lamp chamber being exhausted to an outside region by supplying a gas into said upper chamber while simultaneously exhausting said upper chamber of said gas.

23. A method for cleaning a surface of a substrate, comprising the steps of:
(a) preparing a substrate holding means, an ultraviolet lamp, a processing chamber and a lamp chamber which communicate with each other through an opening, a gas supply source for introducing a gas, a lamp shutter for closing or opening the opening, a first exhausting circuit for exhausting the processing chamber, and a second exhausting circuit for exhausting the lamp chamber;
(b) conveying a substrate to be processed into said processing chamber and causing said substrate to be held by said substrate holding means;
(c) introducing a gas, which is an ozone source, into said lamp chamber and irradiating said gas with ultraviolet rays so as to produce ozone;
(d) driving said lamp shutter to open said opening and to close said second exhausting circuit at the time of processing, so that said produced ozone is introduced from said lamp chamber into said processing chamber and decomposes organic matter attaching on the surface of said substrate, and of subsequently opening said first exhausting circuit to exhaust said processing chamber of a substance generated by decomposition,
(e) closing said lamp shutter and opening said second exhausting circuit, so that said produced ozone is discharged to a region outside of said lamp chamber.

24. A method according to claim 23, wherein:
said lamp shutter is kept closed and the lamp is kept ON during said step (c), so as to produce ozone; and
said opening is kept open to supply produced ozone from said lamp chamber into said processing chamber during said step (d).

25. A method according to claim 23, wherein said ultraviolet lamp is moved parallel to the surface of said substrate during said step (c).

26. A method according to claim 23, wherein the distance between said ultraviolet lamp and the surface of said substrate is varied during said step (c).

27. A method according to claim 23 wherein said step (c) is executed such that said processing chamber is not exhausted during irradiation of ultraviolet rays.

28. A method according to claim 23, wherein said gas supply source supplies air into said lamp chamber as an ozone-producing gas during said step (c).

29. A method according to claim 23, wherein said substrate is a rectangular glass plate designed for use as an LCD, and a plurality of ultraviolet lamps are arranged along the surface of said substrate.

30. A method according to claim 27, wherein a gas is introduced into a region located above said lamp chamber and is then exhausted from the region during said step (d), heat generated in said lamp chamber being exhausted to an outside region along with said gas exhausted from said region above said lamp chamber.

31. A method according to claim 30, wherein a gas is kept introduced into said region above said lamp chamber and simultaneously exhausted therefrom throughout said step (d).

* * * * *